United States Patent
Skov Andersen et al.

(10) Patent No.: US 10,148,235 B2
(45) Date of Patent: Dec. 4, 2018

(54) DEAD TIME COMPENSATION

(71) Applicant: ICEPOWER A/S, Søborg (DK)

(72) Inventors: Kennet Skov Andersen, Søborg (DK); Eskil Jørgensen, Vaerløse (DK)

(73) Assignee: ICEPOWER A/S, Søborg (DK)

( * ) Notice: Subject to any disclaimer, the term of this patent is extended or adjusted under 35 U.S.C. 154(b) by 0 days.

(21) Appl. No.: 15/577,215

(22) PCT Filed: Jun. 1, 2016

(86) PCT No.: PCT/EP2016/062399
§ 371 (c)(1),
(2) Date: Nov. 27, 2017

(87) PCT Pub. No.: WO2016/198302
PCT Pub. Date: Dec. 15, 2016

(65) Prior Publication Data
US 2018/0145649 A1    May 24, 2018

(30) Foreign Application Priority Data
Jun. 9, 2015 (DK) .................................. 2015 00330

(51) Int. Cl.
*H03F 3/217* (2006.01)
*H03K 5/151* (2006.01)
*H03K 17/16* (2006.01)

(52) U.S. Cl.
CPC ......... *H03F 3/2171* (2013.01); *H03K 5/1515* (2013.01); *H03K 17/162* (2013.01)

(58) Field of Classification Search
CPC .................................................... H03F 3/217
(Continued)

(56) References Cited

U.S. PATENT DOCUMENTS 7,279,967 B2 * 10/2007 Quilter ..................... H03F 1/32
330/10
8,305,246 B2 * 11/2012 Kinyua ................... H03F 3/217
341/143

(Continued)

FOREIGN PATENT DOCUMENTS

| WO | WO 01/10017 | 2/2001 |
| WO | WO 01/97384 | 12/2001 |
| WO | WO2004/091096 | 10/2004 |

OTHER PUBLICATIONS

International Search Report and Written Opinion for PCT Application No. PCT/EP2016/062399 filed Jun. 1, 2016 (published as WO 2016/198302 on Dec. 15, 2016) which is the parent application to the instant application, 9 pages.

*Primary Examiner* — Henry Choe
(74) *Attorney, Agent, or Firm* — Harness, Dickey & Pierce, P.L.C.; Anthony G. Fussner

(57) ABSTRACT

The invention relates to a compensator device for compensating signal dependent delay variations, including dead time and reverse recovery time, causing un-linearity in a Class-D amplifier where the compensator device comprises: a first input terminal for receiving an input pulse width modulated input PWM signal comprising pulses with falling flanks corresponding to a falling level transition and rising flanks corresponding to a rising level transition; and a second input terminal configured to receive the signal provided at an output switching node of a Class-D amplifier; an output terminal for providing a compensated output signal; and controllable delay means configured to receive and delay the pulse modulated input signal, thereby providing a delayed version of the input signal to said output terminal of the compensator device. The compensator device further comprises time measuring means configured for measuring the time between a transition of the signal provided at the (Continued)

output terminal of the compensator device and the corresponding transition of the signal at the output switching node of a Class-D amplifier and based on these measurements providing a control signal to the controllable delay means. An advantageous effect of the present invention is that the rising and falling level transition delays will be substantially similar thus substantially removing non-linearity and obtaining substantially correct pulse widths. The invention further relates to a corresponding method, a driver device and a Class-D amplifier.

19 Claims, 8 Drawing Sheets

(58) Field of Classification Search
USPC .............................................. 330/251, 207 A
See application file for complete search history.

(56) References Cited

U.S. PATENT DOCUMENTS

| | | |
|---|---|---|
| 9,648,432 B2 * | 5/2017 | Pan ..................... H04R 29/001 |
| 2005/0099226 A1 | 5/2005 | Risbo et al. |
| 2005/0162228 A1 * | 7/2005 | Putzeys ................. H03F 1/3211 |
| | | 330/251 |
| 2009/0167431 A1 | 7/2009 | Guilherme et al. |
| 2013/0193938 A1 | 8/2013 | Shook |
| 2015/0030169 A1 * | 1/2015 | Pan ..................... H04R 29/001 |
| | | 381/59 |

* cited by examiner

DEAD TIME COMPENSATION

This patent application is a U.S. national stage filing under 35 U.S.C. § 371 of International Application No. PCT/EP2016/062399 filed Jun. 1, 2016 (published as WO 2016/198302 on Dec. 15, 2016), which claims priority of Denmark Application No. PA201500330 filed Jun. 9, 2015. The disclosures of the applications identified in this paragraph are incorporated herein by reference in their entirety.

TECHNICAL FIELD OF THE INVENTION

This invention relates to a switching power conversion system such as DC-AC, DC-DC or AC-AC conversion systems or any combination of the above mentioned. More specifically, the invention relates to compensation of the non-linearity caused by dead time and reverse recovery time in such systems.

BACKGROUND

A well known source of non-linear distortion in Class-D amplifiers is blanking delay, also known as dead time delay. In the following the switching devices of the amplifier will throughout be described as MOSFETs (metal-oxide-semiconductor field-effect transistors), but it is readily understood that also other devices and switching technologies could be used.

In the following the term dead time delay and the effect hereof will be described in some detail.

In a switched amplifier output stage it is not allowed that both MOSFETs are on, i.e. conducting, simultaneously as this would result in short-circuiting the power supply (as state that is known as "shoot through"). If a large electrical current is flowing through the MOSFETs it will normally require a relatively longer time to turn on the MOSFET and a relatively shorter time to turn it off. This results in a variation of the exact time at which turning on and off takes place, and hence in order to avoid shoot through it is necessary to provide a safety interval in which none of the MOSFETs are conducting. This time interval is known as dead time or blanking delay.

The effect of dead time delay is as follows:

During the dead time, none of the power devices (MOSFETs) are conducting. Factors controlling the voltage in the switching node, i.e. the node between the drain terminal of one MOSFET and the source terminal of the other MOSFET, will be the capacitance in the node (including snubbers), inductor current (=load current+capacitor ripple current) and body diodes in the MOSFETs. As switching frequency is several times higher than the LC filter frequency, the inductor current will be relatively stable during a switching cycle, at least at high output current.

A main thing to understand here is that as the amplifier switching node is switching both positive and negative no matter if the output voltage and current is positive or negative. Therefore the low side is regularly on, even when output is positive, resulting in that a current is flowing out of the amplifier in the source to drain direction of the low side MOSFET.

The document: "Time domain analysis of open loop distortion in Class-D amplifier output stages" by Nyboe, Risbo and Andreani, 27th international AES conference, dead time delay and the effect of dead time delay is described in detail. The document among other explains how the distortion can be minimized by using carefully selected dead time, ripple current and turn on/off time. In that case the optimized dead time error can in some cases be made linear with output current (in the case of constant switching frequency), appearing like an additional output resistance. However, for a self-oscillating feedback loop like in most high-performance Class-D amplifiers today, the linear delay will still cause distortion.

The described method has some drawbacks, especially for solutions where the MOSFETs are not integrated:

It will typically require very short dead-time, increased snubbers, high ripple current and soft turn on/off, all of which reduces efficiency.

Turn-on and off time is often dictated by EMI (electromagnetic interference), where a slow turn on is advantageous for obtaining low EMI. Contrary to this, fast turns on and off is advantageous for obtaining high efficiency. Miller effect in the MOSFETs can make weak turn on/off a problem, where the OFF condition MOSFET can be turned on by the Miller capacitor in the MOSFET combined with the flank from the opposite FET turning on, or the ON condition MOSFET can be turned OFF temporarily by its rising flank. This unintended short time turn-on, in the case where the MOSFET should be off has a very detrimental effect on EMI and efficiency, whereas the unintended turn-off while the MOSFET is on is also detrimental for EMI and efficiency for the same reason, although to a lesser extent.

The output filter ripple current will be restricted by capacitive load stability, power dissipation, and loop design. A high ripple current will increase idle loss (like increased snubbers). Idle loss is a weak spot in Class-D amplification, where solutions like varied supplies (Class-G) are considered to reduce idle consumption.

When the system is optimized, larger snubbers, higher ripple current, softer turn on/off will all reduce efficiency and increase idle losses, which, to some extent, contradicts the general idea of Class-D.

Other prior art solutions suggest correcting the delay variation by digital prediction. As the delay variation is dependent on current, and the modulator output is a duty cycle output, controlling output voltage, this correction will only be correct in the case the load impedance and un-linearity is totally well-known by the pre-compensating system, typically a resistive load. These solutions will function well under ideal conditions, but with the highly non-linear and frequency dependent load that a real loudspeaker poses, the correction will be incorrect.

US 2013/0193938 describes a simple means for dead-time compensation in a power supply system that, however, suffers from three major pitfalls:

Firstly, there is only correction of the positive pulse is carried out. It is a system for single polarity voltage supply and not suitable for single polarity voltage supply audio (BTL) either, as this would also require correction of low side pulse. Correcting both sides add more complexity than just adding the same circuit for the negative side.

Secondly, the system is a step-based system, with one logic block for each step. It is a counter based system. The dead-time seen in audio amplifiers will be in the 10-40 ns range, and would require time resolution of at maximum 1 ns, preferably better. This is not possible given the described architecture. Only an analogue system will have sufficient resolution.

Finally, the system does not compensate for the delay in level shifters, gate drive and power stage. The entire delay from rising edge of input signal through the gate driver and to the output of the power switching node is added to the end of the high side pulse, thereby adding substantially too much time. This will generate a severe offset, especially as only the high pulses are corrected.

It would furthermore be possible to suppress non-linearity in Class-D amplifiers using suitable feedback loops in the circuit. However, feedback loops tend to lose their suppressing effect at higher frequencies.

Further, US 2005/0099226 describes a system that dynamically adjusts dead time adaptively to the limit of cross-conduction, indicated by a dynamic measurement of supply current. The dead time is dynamically reduced until cross-conduction is detected, then stepped back to a time just before cross conduction. However, in larger output stages with longer gate transition times, the actual output stage switching time will still depend on load current, which is not contemplate in this document. Reverse recovery in the conducting body diode also adds substantial current dependent delay, which is also not considered in this document.

On the above background, there is a need for a simple means of reducing the detrimental effects of dead time and other signal dependent delays like reverse recovery time in a Class-D amplifier which also is cost-efficient and easy to implement, especially in self oscillating Class-D amplifiers.

SUMMARY OF THE INVENTION

It is therefore an object of the present invention to provide a method and device for dead-time compensation in Class-D amplifiers which alleviate all or at least some of the above-discussed drawbacks of presently known systems.

The above and further objects and advantages are attained by means of a device and a method according to the appended claims. The term exemplary is in the present context to be interpreted as serving as an example, instance, or illustration.

According to a first aspect of the present invention there is provided a method for dead time compensation in a Class-D amplifier, the Class-D amplifier comprising an input terminal for receiving a pulse modulated input signal, a power output stage having two switches, such as MOSFETs, an output switching node and a driver block configured to control the switches, wherein the method comprises:

receiving a pulse modulated input signal at the input terminal, the pulse modulated input signal comprising pulses with falling flanks corresponding to a falling level transition and rising flanks corresponding to a rising level transition;

measuring a delay time between a transition of a signal from a time when a request for a transition is provided to the driver block to a time when a corresponding transition occurs at the output switching node;

delaying the pulse modulated input signal based on the measurement in order to provide a compensated output signal to the driver block, i.e. in order to provide a delayed version of the pulse modulated input signal to the output terminal of the compensator device.

Thus, by means of such a method it is suggested to measure the delay and compensate the next switching transition which at the same time corrects a pulse width. This is done according to the present invention in a linear and simple way that is cheap to implement. The compensation obtained according to the invention will be perfect for slowly changing signals, so that the conditions are the same during the measuring of the delay as it is when applying the correction. The invention may advantageously be used to provide improved linearity, especially in high-power amplifiers with large amounts of dead-time.

Moreover it is hereby possible to delay both the rising and the falling flank, thereby increasing both high and low pulse width without this resulting in too long switching periods, requiring longer and longer delays. This is since the flanks are delayed based on the incoming signal to the driver block, not on pulse lengths, as would be conventionally done, and therefore the measured delay does not measure the applied delay, as the delay is measured after the delay applying blocks.

A transition delay is generally the interval between the time at which a transition is requested and the time at which it actually takes place. In the present context, the transition delay is the interval between the time a request for a transition is received at an input of the driver circuit and the time at which the transition actually takes place at the output node of the amplifier (the node between the interconnected terminals of the two switches), i.e. the time when the voltage at the output node changes its voltage from a high level to a low level. In case of an amplifier with a dual polarity power supply (VDD, 0, VSS) the high level corresponds to a voltage at the output node substantially equal to VDD and the low level corresponds to a voltage at the output node substantially equal to VSS. In case of an amplifier driven by a single polarity power supply, the high level would substantially correspond to VDD and the low level would substantially correspond to zero. For example, in some implementations, the corresponding transition at the output switching node may be considered to occur when this node crosses the 50% voltage between positive and negative supply, (at symmetric, +/−supply, this is the zero crossing), this will then define the output transition time.

Throughout the present description as well as in the claims a transition between a low level and a high level will be referred to as a "high transition" and the corresponding transition delay will be referred to as the "high transition delay". Similarly, a transition between a high level and a low level will be referred to as a "low transition" and the corresponding transition delay will be referred to as the "low transition delay".

In accordance with an exemplary embodiment of the first aspect, the step of measuring a delay time further comprises:

measuring a falling level transition delay from a time when a request for a falling level transition is provided to the driver block to a time when a corresponding transition occurs at the output switching node;

measuring a rising level transition delay from a time when a request for a rising level transition is provided to the driver block to a time when a corresponding transition occurs at the output switching node;

wherein the delaying the pulse modulated input signal further comprises:

upon reception, at the amplifier input terminal, of a rising level transition, adding a function of the immediately previous falling level transition delay to the pulse modulated input signal, thereby providing a compensated rising level transition signal;

upon reception, at the amplifier input terminal, of a falling level transition, adding a function of the immediately previous rising level transition delay to the pulse modulated input signal, thereby providing a compensated falling level transition signal.

The inventors of the present invention also realized that as falling and rising delays are different, this can result in an error. As the difference changes versus output in a non-linear manner, this will result in a non-linear transfer function. According to the invention, at a high transition there is added the old (previous) low transition delay, whereby the result will be that the compensated high transition delay will be the high transition delay plus the last (previous) low transition delay, i.e.:

high_transition_delay_compensated=high_transition_delay+last_low_transition_delay.

Similarly, at the low transition there is according to the invention added the old (previous) high transition delay, whereby the compensated low transition delay will be the low transition delay plus the last (previous) high transition delay, i.e.:

low_transition_delay_compensated=low_transition_delay+last_high_transition_delay.

Consequently, the compensated high and low transition delays will according to these principles of the invention be very similar, making pulse widths correct, which furthermore removes the associated non-linearity.

The function of a falling/rising level transition delay is to be understood as a manipulated version of the actual measured falling/rising level transition delay. This is order to minimize unnecessary delay time and compensate for the propagation delay of the signal through the driver block.

For example, the function of the immediately previous falling level transition delay is the measured immediately previous falling level transition delay subtracted by a minimum falling level transition delay, and wherein the function of the immediately previous rising level transition delay is the measured immediately previous rising level transition delay subtracted by a minimum rising level transition delay. The minimum falling level transition delay can be a first predefined constant and the minimum rising level transition delay can accordingly be a second predefined constant. However, alternatively the minimum falling level transition delay can be an earliest occurring falling level transition delay and the minimum rising level transition delay can be an earliest occurring rising level transition delay. The earliest occurring falling/rising level transition delay can thus accordingly be a dynamic variable which is actively measured and adjusted whereby the effectively added delay to the input signal can be kept to a bare minimum in order to increase efficiency of the system.

According to another embodiment of the first aspect of the invention the rising level transitions delay(s) and the falling level transition delay(s) that are added to the pulse modulated input signal are individually controllable.

Further, according to a second aspect of the present invention there is provided a compensator device for dead time compensation in a Class-D amplifier, the compensator device comprising:

a first input terminal for receiving a pulse modulated input signal comprising pulses with falling flanks corresponding to a falling level transition and rising flanks corresponding to a rising level transition;

a second input terminal configured to receive an amplified signal provided at an output switching node of the Class-D amplifier;

delaying circuitry configured to receive and delay the pulse modulated input signal, in order to provide a compensated output signal to an output terminal of the compensator device, i.e. in order to provide a delayed version of the pulse modulated input signal to an output terminal of the compensator device;

measuring circuitry configured to:
measure a transition delay from a time when a request for a transition of a signal provided at the output terminal of the compensator device to the corresponding transition of the amplified signal at the output switching node;

generate a control signal to the delay unit based on the measurement, whereby the rising and falling level transition delays will be substantially similar thus substantially removing non-linearity and obtaining substantially correct pulse widths.

With this aspect of the invention, similar advantages and preferred features are present as in the previously discussed aspect of the invention and vice versa.

The compensator device is in accordance with an exemplary embodiment implemented as an integrated circuit (IC). Furthermore, the term circuitry does not necessarily mean that the component is solely based on hardware but instead the delaying circuitry and measuring circuitry can be a combination of software and hardware, however, in some embodiments comprise only one of the two.

According to another embodiment of the second aspect of the invention the measuring circuitry comprises:

a first measuring circuitry configured to measure a falling level transition delay from a time when a request for a falling level transition is provided at the output terminal of the compensator device to a time when the output switching node of the Class-D amplifier undergoes a corresponding falling level transition;

generate a first control signal based on the measured falling level transition delay;

a second measuring circuitry configured to measure a rising level transition delay from a time when a request for a rising level transition is provided at the output terminal of the compensator device to the time when the output switching node of the amplifier undergoes a corresponding rising level transition;

generate a second control signal based on the measured rising level transition delay;

and wherein the delaying circuitry further comprises:
a first delaying circuitry having an input terminal connected to the first input terminal of the compensator device, an output terminal connected to the output terminal of the compensator device and a control input terminal for receiving the first control signal from the controller, wherein the first delaying circuitry is configured to:
upon reception, at the first input terminal, of a rising level transition, add a function of an immediately preceding measured falling level transition delay, in order to provide a compensated rising level transition signal to the output terminal of the compensator device;

a second delaying circuitry having an input terminal connected to the first input terminal of the compensator device, an output terminal connected to the output terminal of the compensator device and a control input terminal for receiving the second control signal from the controller, wherein the second delaying circuitry is configured to:
upon reception at the first input terminal of a falling level transition, add a function of the immediately preceding measured rising level transition delay, in order to provide a compensated falling level transition signal to the output terminal of the compensator device.

Hereby the total raising and falling level transition delays will be substantially similar thus substantially removing non-linearity and obtaining substantially correct pulse widths. In one exemplary embodiment, the first delaying circuitry and the first measuring circuitry are integrated into one first controller, and similarly, the second delaying circuitry and the second measuring circuitry are integrated into one second controller. It is advantageous to have the same block or unit performing both the measurement and the delay in order to match the respective measurements and delays optimally.

According to another embodiment of the second aspect of the invention the compensator device further comprises:

an AND-gate having a first input connected to the first input terminal of the compensator device, a second input and an output;

an OR-gate having a first input connected to the output of the AND-gate, a second input and an output connected to the output terminal of the compensator device;

a first comparator having a first input, a second input and an output connected to the second input of the OR-gate;

a second comparator having a first input, a second input and an output connected to the second input of the AND-gate;

wherein the second input of each comparator is connected to a reference voltage;

wherein a first capacitor connected in parallel with a first resetting switch both are further connected between the first input of the first comparator and a ground terminal; and wherein a second capacitor connected in parallel with a second resetting switch both are connected between the first input of the second comparator and a ground terminal;

wherein the compensator device further comprises a first charging current source connected in series with a first charging switch, which is connected in series with a first discharging switch, whereby a first node between the first charging switch and the first discharging switch is formed and wherein the first discharging switch is further connected to a first current sink;

wherein the compensator device further comprises a second current source connected in series with a second charging switch, which is connected in series with a second discharging switch, whereby a second node is formed between the second charging switch and the second discharging switch and wherein the second discharging switch is connected to a second current sink; and wherein the first input of the first comparator is connected to the first node and the first input of the second comparator is connected to the second node.

According to yet another embodiment of the second aspect of the invention a discharging current flowing through each of the first current sink and the second current sink is substantially equal to the corresponding charging currents flowing through the first current source and the second current source, respectively. In other words, in the compensator device the corresponding current sources and current sinks that charge and discharge a given one of the first and second capacitor are matched to each other such that the discharging current flowing through the respective current sinks are substantially equal to the corresponding charging currents flowing through the respective current sources.

According to a third aspect of the present invention there is provided a driver device for a Class-D amplifier, the driver device comprising:

a driver block comprising:
an input terminal for receiving a pulse modulated input signal;
three output terminals connected to a gate junction of a first switch, a gate junction of a second switch and a switching node of a power stage of the Class-D amplifier;

a compensator device according to the second aspect of the invention, wherein the output terminal of the compensator device is connected to the input terminal of the driver block;

wherein the driver device further comprises a first input terminal connected to the input terminal of the compensator device and a second input terminal connected to the switching node of power stage. The driver device can also be implemented as an integrated circuit similarly to the compensator device of the second aspect.

With this aspect of the invention, similar advantages and preferred features are present as in the previously discussed aspects of the invention.

According to a fourth aspect of the present invention there is provided a Class-D amplifier comprising:

an output stage including a first and second output switches, such as MOSFET's, connected in series having an intermediate switching node for connection to an output terminal of the amplifier;

wherein said output stage is either connected to a separate (and conventional) driver block that is controlled by a compensator device according to the second aspect of the invention or, as an alternative, the output stage can be controlled by a driver device according to the third aspect of the present invention.

With this aspect of the invention, similar advantages and preferred features are present as in the previously discussed aspects of the invention.

These and other features of the present invention will in the following be further clarified with reference to the embodiments described hereinafter.

BRIEF DESCRIPTION OF THE DRAWINGS

For exemplifying purposes, the invention will be described in closer detail in the following with reference to embodiments thereof illustrated in the attached drawings, wherein.

DETAILED DESCRIPTION

In the following detailed description, preferred embodiments of the present invention will be described. However, it is to be understood that features of the different embodiments are exchangeable between the embodiments and may be combined in different ways, unless anything else is specifically indicated. Even though in the following description, numerous specific details are set forth to provide a more thorough understanding of the present invention, it will be apparent to one skilled in the art that the present invention may be practiced without these specific details. In other instances, well known constructions or functions are not described in detail, so as not to obscure the present invention. For example, in the following both of the described embodiments can be implemented by analog means. However, digital implementations of devices according to the principles of the invention or combined analog and digital implementations would also be possible and would also fall within the scope of the invention.

Further, FIGS. 1 through 5 serve to at least partly provide a background of the invention and furthermore to show results of measurements and simulations relating to the invention.

Figure 6:
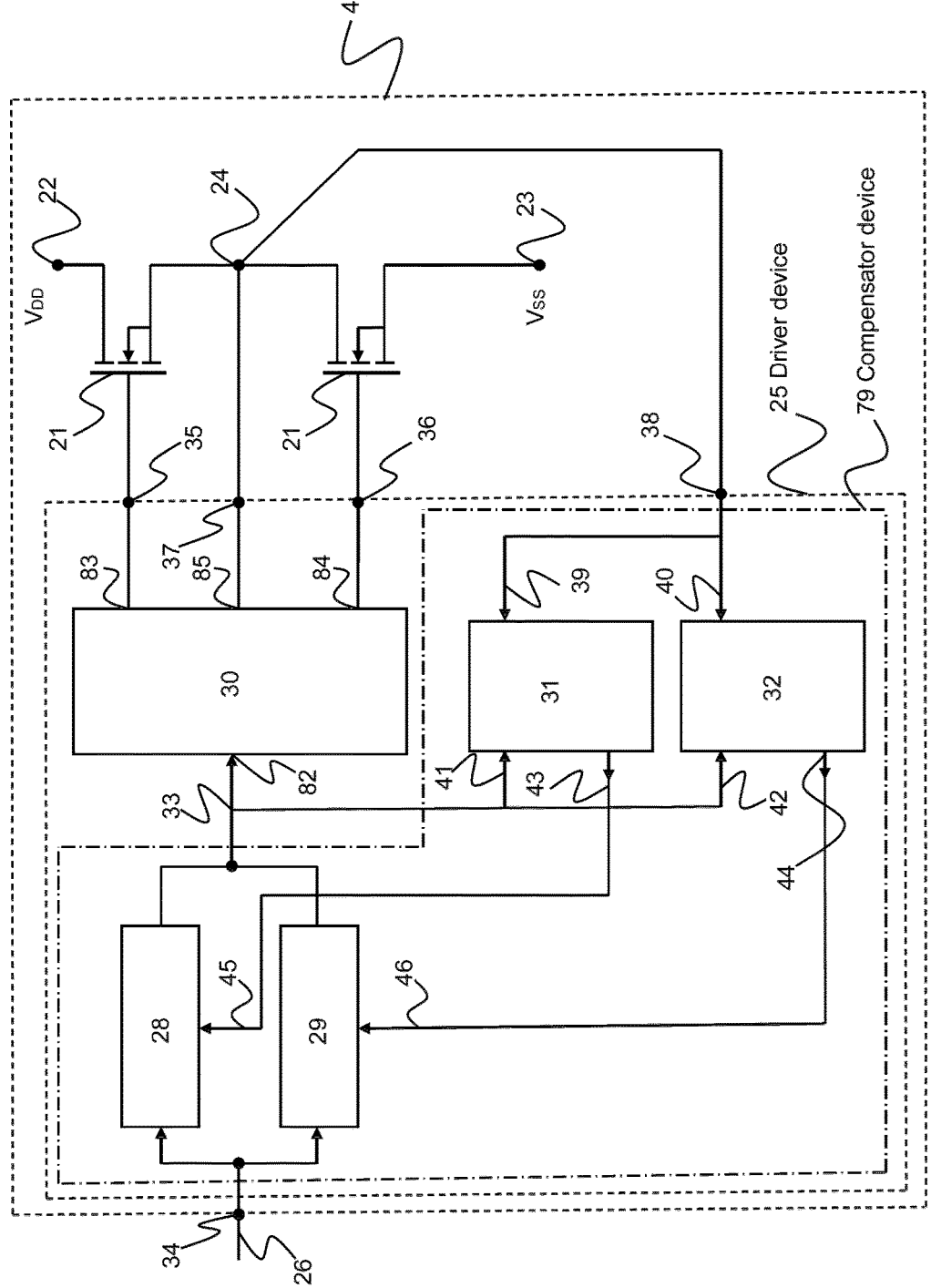
FIG. 6 shows a schematic illustration of a Class-D amplifier in accordance with an embodiment of the present invention.
Figure 7:
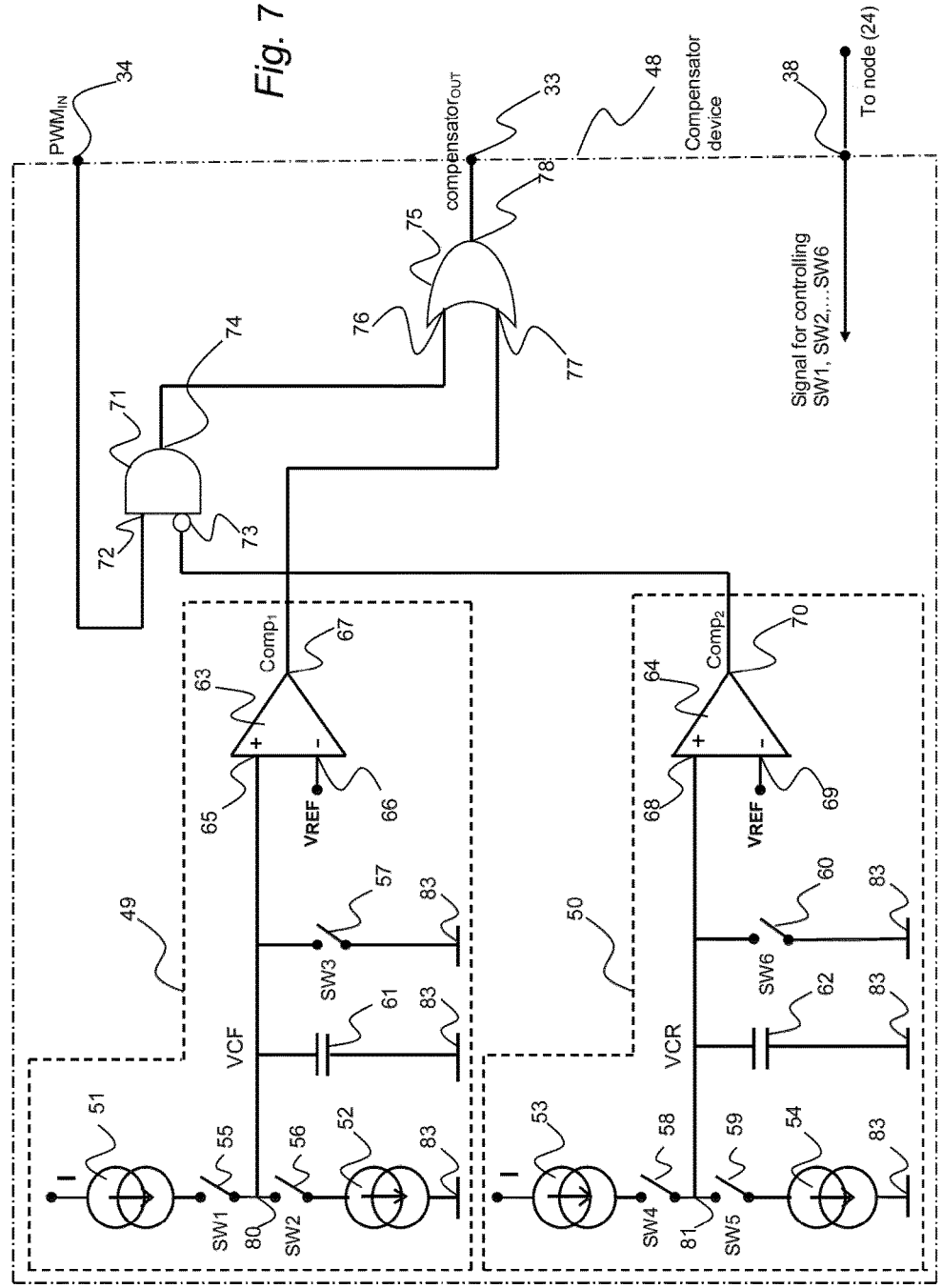
FIG. 7 shows a schematic circuit diagram of a compensator device in accordance with an embodiment of the present invention.
Figure 8:
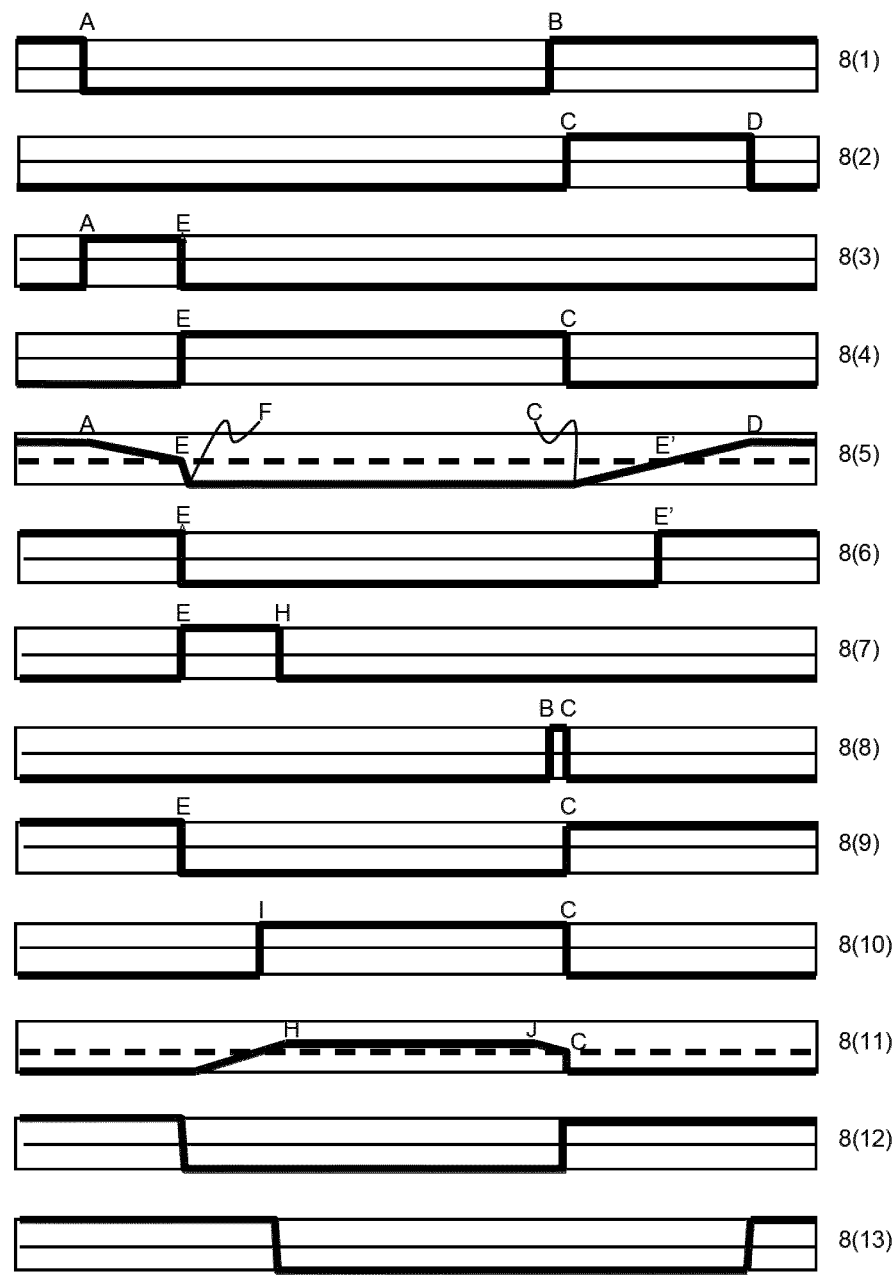
FIG. 8 shows a set of signal diagrams illustrating various states of the circuit in the embodiment shown in FIG. 7.

FIGS. 6, 7 and 8 illustrate two alternative embodiments of a device according to the present invention where their structures are described and their functions are explained.

Figure 1:
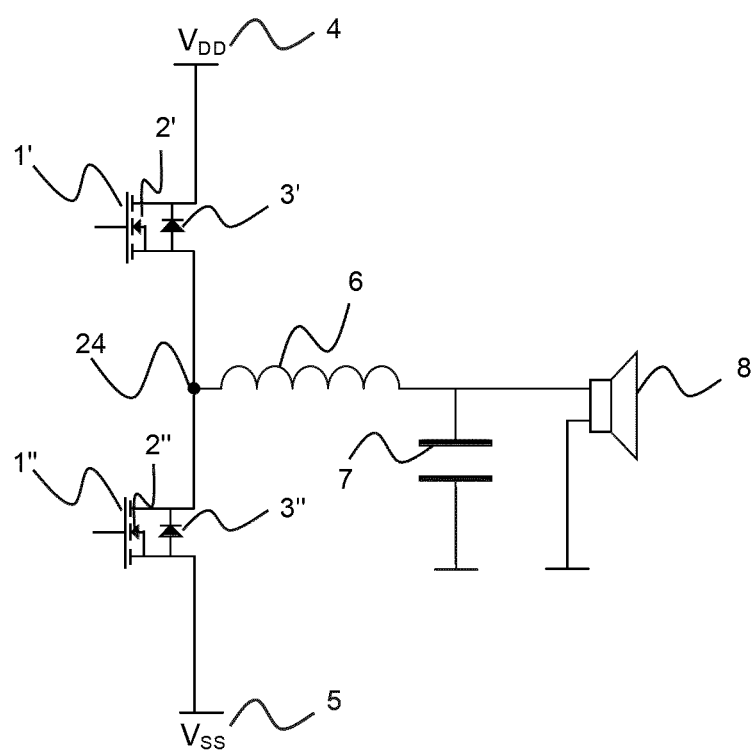
FIG. 1 shows a schematic illustration of an output stage in a Class-D amplifier connected to an associated load.

With reference to FIG. 1 there is schematically shown an illustration of an output stage in a Class-D amplifier and an associated load. The output stage comprises a pair of switches, here in the form of two MOSFETs 1', 1" connected in series between one polarity 4 (e.g. positive, VDD) of a power supply and the second polarity 5 (e.g. negative, VSS) of the power supply. The drain terminal of the first MOSFET 1', often called high side MOSFET, is connected to the source terminal of the other MOSFET 1", often called low side MOSFET, at the output node 24 of the output power stage. In this particular example there a load connected to the output node 24, the load comprising an inductor 6, a capacitor 7 and a loudspeaker 8. As explained in the foregoing background section, it is undesirable to have both of the MOSFET 1', 1" turned on, i.e. conducting, simultaneously as this would result in short-circuiting the power supply 4, 5 (VDD and VSS).

If a large electrical current is flowing through the MOSFETs 1', 1" it will normally require a relatively longer time to turn the MOSFETs on and a relatively shorter time to turn them off. This results in a variation of the exact time at which turning on and off takes place (see FIG. 2), and hence, as discussed earlier, it is necessary in order to avoid shoot through, to provide a safety interval in which none of the MOSFETs 1', 1" are conducting. This time interval is known as dead time or blanking delay.

During the so called dead time, none of the MOSFETs 1', 1" is conducting. Factors controlling the voltage in the switching node 24, i.e. the node between the drain terminal of the high side MOSFET 1' and the source terminal of the low side MOSFET 1", will be the capacitance (such as the load capacitance 7, the drain-source capacitance of the MOSFETs, etc.) in the node 24 (including snubbers), current through the load inductor 6 (=load current+capacitor ripple current) and body diodes 3', 3", respectively, in the MOSFETs. As switching frequency is several times higher than the LC filter frequency, the inductor current will be relatively stable during a switching cycle, at least at a high output current.

Figure 2:
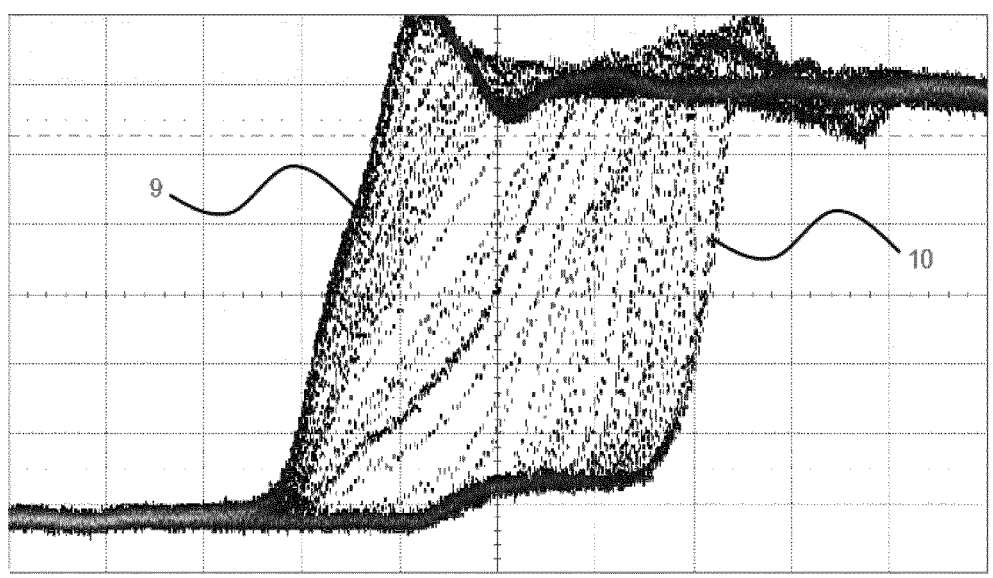
FIG. 2 shows a plot of the variation of low to high side transition delay.

FIG. 2 serves to show an illustration of the variation of low to high side transition delay due to the nature of dead time, reverse recovery and slower turn-on at higher current. The earliest occurring transition flank is indicated by reference numeral 9 and the latest occurring transition flank is indicated by reference numeral 10. A plurality of actual transition flanks are seen between the earliest 9 and latest 10 flanks.

Figure 3:
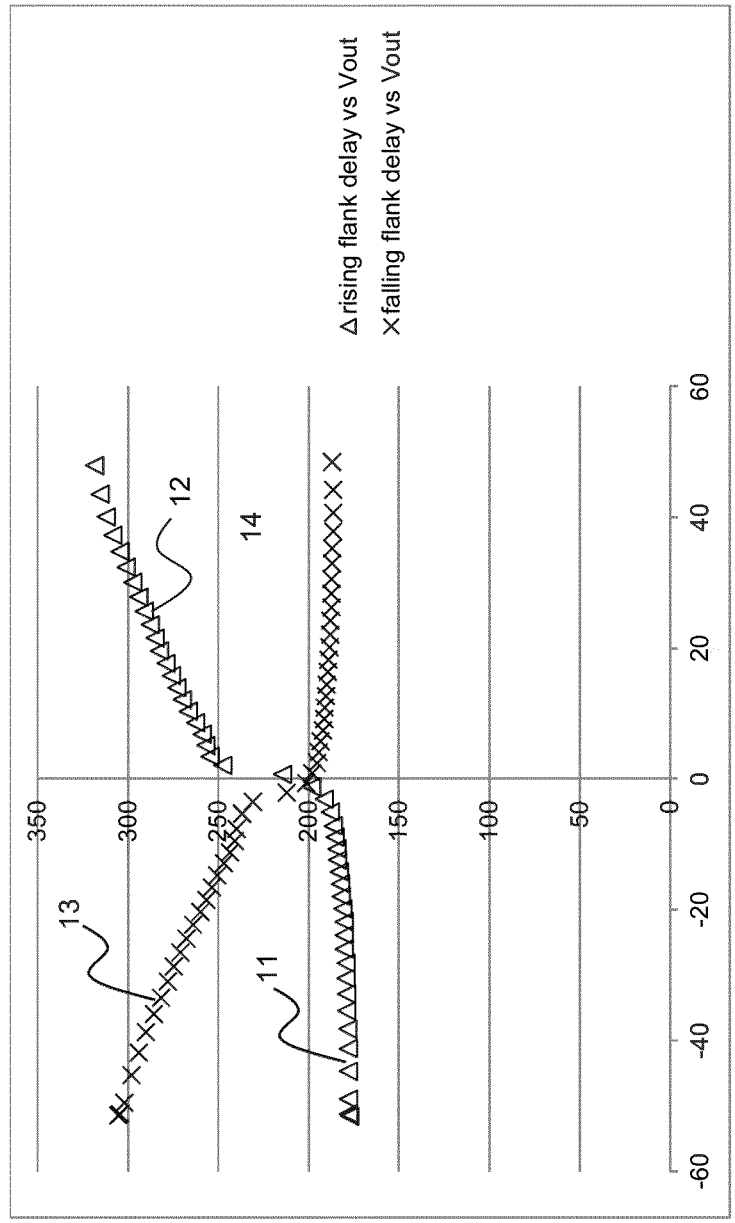
FIG. 3 shows a plot of measured nanosecond delays of falling and rising transitions as a function of output voltage $V_{OUT}$ in a Class-D amplifier.

Further, FIG. 3 shows an illustration of the delay of falling 13, 14 and rising 11, 12 transition times measured in nano-seconds as a function of the output voltage $V_{OUT}$ on a conventional Class-D amplifier. The plot illustrates that the delays of the falling and rising flank change in different, non-linear manners depending on the output current. Consequently, this means that the pulse widths will consequently be affected whereby a non-linearity of the transfer function of the output stage will be generated.

Figure 4:
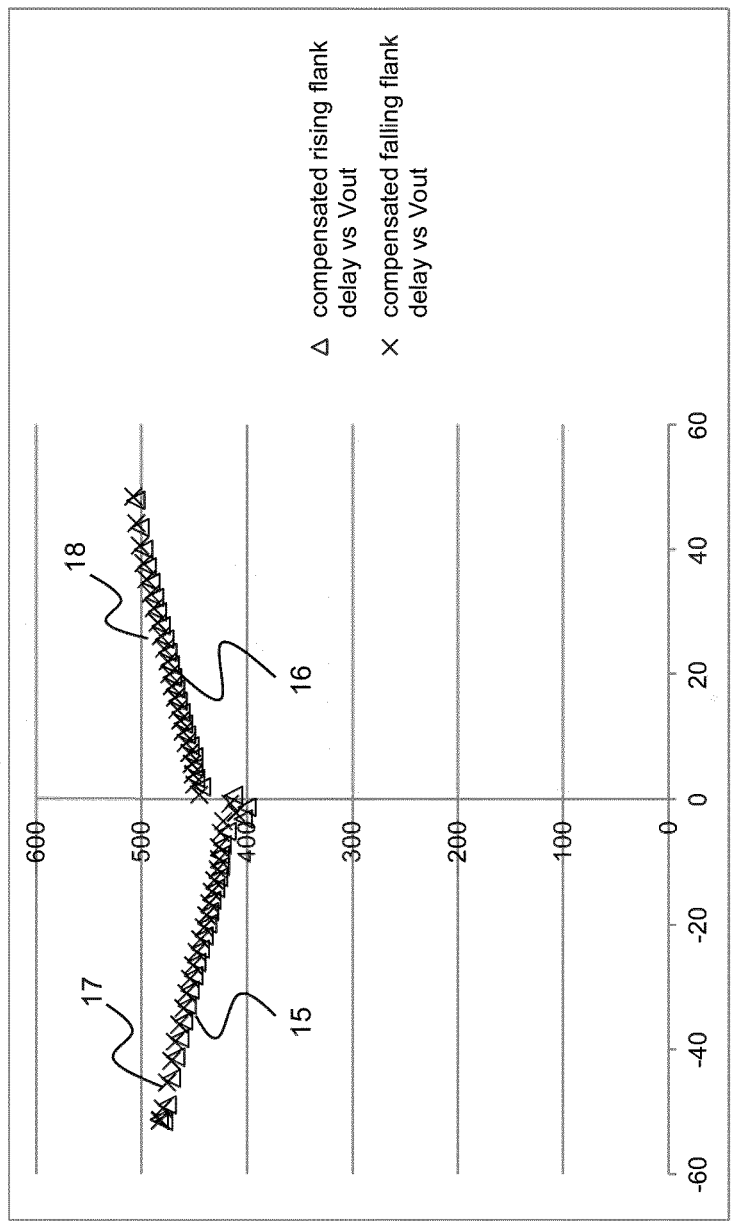
FIG. 4 shows the same measurement data as shown in FIG. 3, but mathematically manipulated to add the delay of the former transition to the current transition in accordance with an embodiment of the invention.

FIG. 4 shows the same measurement data as previously shown in FIG. 3, but mathematically manipulated according to the expressions:

high_transition_delay_comp=high_transition_delay+ last_low_transition_delay and low_transition_delay_comp=low_transition_delay+ last_high_transition_delay Furthermore, FIG. 4 serves to illustrate that the delay is not constant, but as rising 15, 16 and falling 17, 18 delays are the same at the same output current, the output pulse widths will be equal to the input pulse widths, resulting in a more linear system. In other words, FIG. 4 illustrates that the delay is not constant, but as rising and falling delays are the same at the same output current, output pulse widths are equal to input pulse widths, resulting in a more linear system, which could have been made more linear by making simple adjustments on the power stage.

Figure 5:
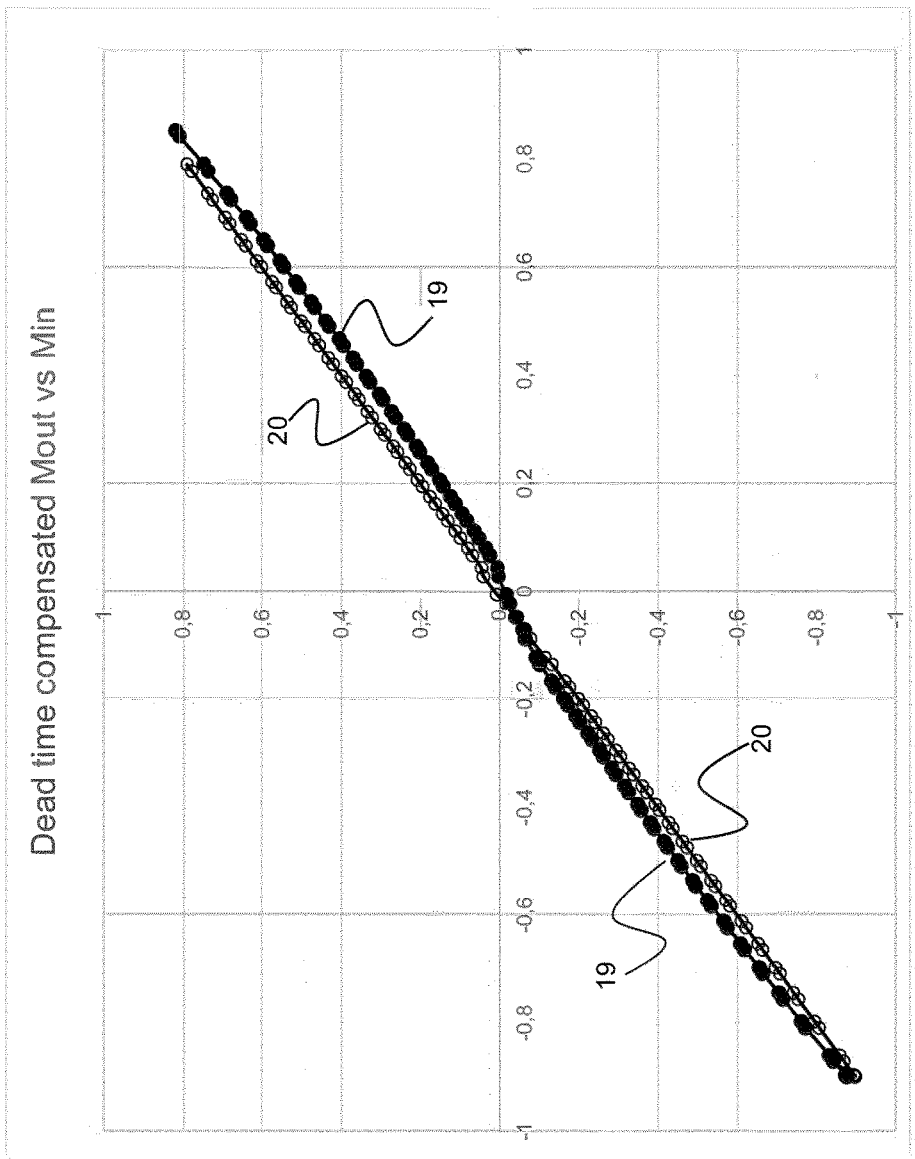
FIG. 5 shows a comparison of the modulation index at the output of the power stage as a function of modulation index of the signal provided into the driver, between a conventional system and a system in accordance with an embodiment of the present invention.

Moreover, FIG. 5 shows an example of the "linearising" effect of the inventive concept by plotting the modulation index at the output of the power stage as a function of modulation index of the signal provided into the amplifier, where curve 19 (marked by filled circles) shows the uncompensated (conventional) results and curve 20 (marked by unfilled circles) shows the mathematically compensated result, in accordance with an embodiment of the invention, which is substantially more linear than the uncompensated curve 19.

FIG. 6 illustrates by means of a schematic block diagram a Class-D amplifier 47 comprising a driver device 25, according to an embodiment of the invention. The driver device 25 is indicated by broken lines in the figure. The driver device 25 can for instance be implemented as a single integrated circuit; however, other implementations are also possible. The driver device 25 comprises a driver block 30 which includes traditional/conventional dead time functionality. The driver device 25 further comprises a compensator device 79, also indicated by broken lines in the figure that, in the embodiment shown, comprises a delaying unit, here in the form of two delay blocks 28, 29 (for the high/rising transition delay and the low/falling transition delay respectively) and a corresponding time measuring unit, here in the form of two measuring blocks 31, 32 (for measuring the low/falling transition delay and the high/rising transition delay respectively). It is to be understood that each of the measuring unit and the delaying unit can be realized as single units, however, in this particular exemplary embodiment two separate blocks in each of the units are illustrated as it is considered to facilitate understanding of the inventive concept.

The power stage of a Class-D amplifier 47 comprises a pair of series coupled MOSFETs 21 that are connected as shown between the dual polarities 22, 23 ($V_{DD}$ and $V_{SS}$) of the power supply and to the output node 24 of the amplifier 47. At the input terminal 34 of the amplifier (which in this particular embodiment is also the input terminal of the driver device 25) there is provided a pulse modulated input signal 26, $PWM_{IN}$, (e.g. pulse width modulated signal, PWM signal, or pulse depth modulated signal, PDM signal).

The driver device 25, as mentioned, comprises a driver block 30 configured to drive each respective output MOSFET 21 and a compensator device 79 including time measuring blocks 31 and 32, and delay blocks 28 and 29. A first time measuring block 31 is configured for measuring the delay between the falling edge (falling level transition) from the time when a logic signal on the compensator output terminal 33 provides a falling level transition request to the driver block 30 to the time when the output switching node 24 undergoes a corresponding falling level transition, i.e. changes state (crosses zero in the dual supply ($V_{DD}$, $V_{SS}$) case used in this illustration/embodiment). The measured delay can optionally be reduced to only include a minimum variation, which means that the function of a measured falling level transition delay corresponds to how much the falling flank occurred later than earliest expected. The next rising flank on the pulse modulated input signal 26 is then delayed with the function of the measured value, by the first delaying block 28, effectively making the delay of the rising flank as seen from the outside of the driver circuit 25 equal to rising flank (internal) delay plus the last falling flank (internal) delay.

Next, the second time measuring block 32 is configured to measure the next, rising level transition delay by measuring the delay from when the output 33 of the compensator device 79 (i.e. the output of the first delay block 28) to a corresponding rising level transition of the output switching node 24. Subsequently, the falling transition is delayed with the function of the measured value by the second delay block 29, analogously to the above described delaying procedure made by the first delaying block 28. This effectively makes the falling edge delay, as seen from the outside, equal to (internal) falling edge delay plus last (internal) rising edge delay. Both of these externally seen delays will be close to equal, which has a linearising effect and effectively makes pulse widths correct.

The embodiment describing two blocks 31 and 32 for measuring and two blocks 28 and 29 for delaying is only one out of several ways to implement the compensator device of the invention. According to a preferred embodiment of the compensator device, the same block measures and delays, i.e. blocks 28 and 31, and blocks 29 and 32, are respectively integrated, in for example, two separate controllers. Alternatively, one single controller may be configured to perform the above described process steps. It is advantageous to have the same block or unit performing both the measurement and the delay in order to match the respective measurements and delays optimally.

Referring now to FIGS. 7 and 8 there is shown and described another embodiment of a compensator device according to the present invention, the compensator device being generally indicated by reference numeral 48.

The compensator device shown in FIG. 7 performs both time measurements and delaying. The device comprises two basically identical sections 49 and 50, respectively, an AND-gate 71 and an OR-gate 75. The input to the compensator device 48 is the input signal $PWM_{IN}$ which in turn is provided to the non-inverting input 72 of the AND-gate 71.

A first section 49 comprises two current sources 51, 52, one first charging current source 51 and one first discharging current source 52, with corresponding charging 55 and discharging 56 switches (SW1, SW2), respectively. The first charging current source 51 is configured to charge a first capacitor 61 when the first charging switch (SW1) is closed, while the first discharging switch (SW2) and the first resetting switch (SW3) are open. The first discharging current source 52 is configured to discharge the first capacitor 61 when the first discharging switch (SW2) is closed while the first charging switch 55 and the first resetting switch 57 are open. The first resetting switch 57 is coupled in parallel with the first capacitor 61 between the non-inverting input of the comparator 63 and ground 83. The voltage $V_{CF}$ across the first capacitor 61 is provided to the non-inverting input 65 of the comparator 63. The inverting input 66 of the first comparator 63 is coupled to a reference voltage $V_{REF}$ used to set the threshold of the first comparator 63.

The second section 50 is very similar to the first section 49 and also comprises two current sources 53, 54, namely a second charging current source 53 and a second discharging current source 54, with corresponding second charging and discharging switches 58, 59 (SW4, SW5), respectively. The second charging current source 53 is configured to charge the second capacitor 62 when the second charging switch 58 is closed and the other two switches (SW5, SW6) in the second section 50 are open. Analogously, the second discharging current source 54 is configured to discharge capacitor 62 when the discharging switch is closed and the other two switches (SW4, SW6) in the second section are open. The second resetting switch 60 (SW6) is coupled in parallel with the second capacitor 62. In more detail, the second discharging switch 60 is coupled in parallel with the second capacitor 62 between the non-inverting input of the second comparator 64 and ground 83. The voltage on $V_{CR}$ across the second capacitor 62 is provided to the non-inverting input 68 of the second comparator 64. The inverting input 69 to the comparator 64 is coupled to a reference voltage $V_{REF}$ used to set the threshold of the second comparator 64.

In addition to the described sections 49 and 50, the compensator device 48 according to the embodiment of the invention shown in FIG. 7 comprises an AND-gate 71 and an OR-gate 75. The input signal $PWM_{IN}$ is provided a non-inverting input of the AND-gate 71. The output from the first comparator in the first section 49 is coupled to one input 77 of the OR-gate 75 and the output from the second comparator 64 in the second section 50 is coupled to an inverting input 73 of the AND-gate 71. The non-inverting input 72 of the AND-gate 71 receives the pulse modulated input signal $PWM_{IN}$ which is the pulse modulated signal fed to the amplifier. The output 74 of the AND-gate 71 is coupled to the other input 76 of the OR-gate 75. The resulting output signal, i.e. the compensated falling/rising level transition signal, is provided from the output terminal of the OR-gate 75.

The shown current sources can all be calibrated for the same current magnitude by applying careful design for good matching; this is easily performed in a chip. The two capacitors 61, 62 are as matched as possible, however, the proposed circuit design is robust and extreme matching is not required. The output signal from the compensator device 48, which is present at node 33, is the compensated signal provided to the driver block 30 and is similar to the input signal (26 in FIG. 6), but a little delayed with a varying delay to compensate for the power stage (dead) time distortion. The compensator device output signal at node 33 goes to a regular driver circuit, (e.g. the driver block 30 in FIG. 6), which affects the output to the power MOSFETs 21, and consequently an amplified output signal of this power stage at the so called switching node 24 is provided.

The six switches (SW1, SW2, . . . , SW6) comprised by the compensator device and shown in FIG. 7 are preferably controllable as described below by the logical states at various points in the circuit as well as by the logical state of the pulse modulated input signal (ref. 26 in FIG. 6) and the compensator device output signal (compensated transition signal) provided at the output 33 of the compensator device 48 as described above. The controllable switches can for instance be implemented by MOSFETs or the like and controlled by a separate controller.

The following description starts when switching is active (not start-up), and input is positive. The upper circuit capacitor 61 is charged ($V_{CF}$) by the last transition, corresponding to the delay measured at a rising transition.

Next, the input signal, $PWM_{IN}$ which is present at the non-inverting input 72 of the AND-gate 71 goes low (e.g. zero if the input signal is approximated as binary), and consequently a delay should now be added to the falling flank. As $PWM_{IN}$ goes low, the first discharging switch 56 (SW2) is turned on, discharging the VCF first capacitor 61 from its stored voltage linearly through the first discharging current source 52. The first discharging current source 52 thus functions as a well-defined current sink through which the discharge current from the first capacitor 61 flows. The first capacitor 61 is preferably discharged with a current of the same magnitude as when it was originally charged, for measuring the rising flank delays.

When the discharging curve, i.e. the voltage across the first capacitor 61, reaches the comparator reference voltage provided at the inverting terminal 66 of the first comparator 63, the delay is ended, and the output signal of the compensator device, which is generated at the output terminal 78 of the OR-gate 75 is set low, requesting the power stage to go low, and the first capacitor 57 is pulled low by the first resetting switch 57 (SW3).

This will in turn trigger the second measuring circuit 50, wherein the charging of the voltage $V_{CR}$ across the second capacitor 62 will be used to measure time for a falling level transition delay. This is measured by turning the second charging switch 58 (SW4) on from a point in time when the compensator output signal at the compensator output node 33 makes a low transition to when the output switching node (the output node 24 of the power stage of the amplifier in FIG. 6) makes the corresponding low transition. Hereby the second capacitor is charged linearly via the second charging current source 53 in order to measure the time this event takes.

Next, when the input signal $PWM_{IN}$ goes high (e.g. corresponding to a 1 if the input signal is approximated as a binary signal), it triggers the discharging of the second capacitor 62 through the second discharging current source 54 (which acts as a well-defined current sink for the discharge current from the second capacitor 62) of the voltage $V_{CR}$ across the second capacitor 62 by turning the second discharging switch 59 (SW5) on. When the voltage $V_{CR}$ reaches the comparator reference voltage 69, which is provided at the inverting input of the second comparator, the compensator output 33 will consequently be set high, requesting the power stage to go high. It also enables the second resetting switch 60 (SW6) to pull the voltage $V_{CR}$ low and then to turn the first charging switch 55 (SW1) on to measure the time from when the compensator device 48 output signal (at output 33) went high to the time when the switching node of the power stage (i.e. node 24 in FIG. 6) goes high. As the amplifier switching node goes high, the first charging switch 55 (SW1) is released/opened, and the charged voltage $V_{CF}$ is maintained. This is the same state as in the beginning of this detailed explanation, and this series of events will then all take place repeatedly.

As mentioned, it is easy to match a charging and a discharging current in a chip. The absolute size of the current magnitudes and the capacitor values can often times be hard to accurately control and therefore may vary. However, since one capacitor is used for measuring the delay, and the same capacitor is used for applying the measured delay to the next flank, the variation is therefore not a problem in the proposed inventive system.

The reference voltage on terminals 66 and 69, respectively, effectively subtracts time from the applied delay. The measured delay includes a fixed minimum delay plus a variation. It is not desirable to delay the signal more than needed, as a delay is a disadvantage for the feedback loop design on the amplifier. Therefore, by setting a reference voltage for the comparators to more than zero volts, some of the minimum delay can be subtracted. Due to the capacitor size variation between chips, this subtraction will vary. As it is desirable to maximally subtract the minimum delay, it is typically needed to subtract less to include a margin for this variation. Thus, the reference voltage can be set to a fixed constant value in order to remove a minimum falling/rising level transition delay or it may be a dynamic value which is self adapting to the earliest occurring falling/rising level transition delay (e.g. ref. 9 in FIG. 2).

An important issue is whether it is possible to delay both the rising and the falling flank, thereby increasing both high and low pulse width and whether this would not result in too long switching periods, requiring longer and longer delays. However, according to the method and device according to the invention the flanks are delayed based on the incoming signal, not on pulse lengths. Therefore, the measured delay does not measure the applied delay, as the delay is measured after the delay applying blocks (e.g. blocks 28 and 29 in FIG. 6).

The function or operation of the compensator device according to the exemplary embodiment of the invention shown in FIG. 7 are explained further with reference to FIG. 8 which shows a set of illustrative timing diagrams or signal diagrams of the operation of various elements in the circuit shown in FIG. 7. The switches 55-60 illustrated in FIG. 7 will be referred to by their other reference signs (SW1, SW2 . . . SW6) in the following discussion in reference to FIG. 8.

The state of the respective switches (SW1 through SW6) is in this example given by the following logical expressions:

(SW1)=compensator output AND NOT power amplifier switching node AND NOT (SW2)

(SW2)=NOT $PWM_{IN}$ AND first comparator output (SW3)=NOT first comparator output AND NOT compensator output (SW4)=NOT compensator output AND power amplifier switching node AND NOT (SW5)

(SW5)=$PWM_{IN}$ AND second comparator output (SW6)=NOT second comparator output AND compensator output Signal diagram 8(1) in FIG. 1 shows the input signal $PWM_{IN}$ provided to terminal 72 of the AND-gate 71. At moment in time indicated by arrow A $PWM_{IN}$ goes from a high level to a low level, i.e. experiences a falling flank. $PWM_{IN}$ then remains at a low level until a moment in time indicated by arrow B, at which time it again goes to a high level.

The subsequent timing diagrams, 8(2) through 8(11), illustrate the respective states of the switches (SW1), (SW2) ... (SW6) and the resulting voltages across the first and the second capacitor 61, 62, respectively.

Diagram 8(2) shows the state of (SW1), where a high level of the curve represent a state where (SW1) is on and a low level represents a state where (SW1) is off.

Diagram 8(3) shows similarly the state of (SW2) and diagram 8(4) shows similarly the state of (SW3).

Signal diagram 8(5) shows the voltage $V_{CF}$ across the first capacitor 61 and the reference voltage applied to the comparator at the inverted input 66 is indicated by the dashed/broken line.

At point A in FIG. 8 (SW1) is turned off and (SW2) is turned on. This makes the charged first capacitor 61 discharge (linearly) through the first discharging current source 52 as seen between points A and E in diagram 8(5). When $V_{CF}$ reaches the comparator threshold voltage, $V_{REF}$, (SW3) is turned on and (SW2) is turned off thus forcing the voltage $V_{CF}$ across the first capacitor 61 to zero at a point F in time.

Diagram 8(6) shows the resulting signal at the output of the first comparator 63.

Continuingly, signal diagram 8(7) shows the state of (SW4). (SW4) is turned on (closed) when the comparator output voltage (or output signal) from the first comparator 63 drops to zero at point E and it remains turned on until the point H where the amplifier output switching node 24 goes low. The interval between points E and H effectively determines for how long a period of time the second capacitor 62 will be charged as seen by the rising voltage magnitude $V_{CR}$ shown in diagram 8(11) in the figure.

Further, diagram 8(8) shows the state of (SW5). (SW5) is only on (i.e. closed) during the short interval between B and C, during which, the voltage $V_{CR}$ across the second capacitor 62 falls linearly until it reaches the threshold voltage of the second comparator 64 which is determined by the reference voltage $V_{REF}$ applied to the second comparator 64 at the inverting input 69, indicated by the dashed line in diagram 8(11).

Diagram 8(9) shows the state of (SW6). (SW6) is off (i.e. open) when second capacitor 62 discharges through the second discharging current source 54, but is turned on (i.e. closed) when $V_{CR}$ reaches the threshold voltage $V_{REF}$ of the second comparator 64, thereby forcing $V_{CR}$ to zero.

Diagram 8(10) shows the output voltage (or output signal) of the second comparator 64. The output voltage at the output of the second comparator 64 is high when $V_{CR}$ is above the threshold voltage $V_{REF}$ and drops to zero when $V_{CR}$ goes below $V_{REF}$.

Diagram 8(11) shows the voltage $V_{CR}$ across the second capacitor 62. This voltage rises (linearly) during the interval in which the second capacitor 62 is charged by means of the second charging current source 53 and begins to fall when the capacitor 62 is discharged by means of the second discharging current source 54. When (SW5) is turned off and (SW6) is turned on, $V_{CR}$ drops to zero, which in this example occurs at point C.

Diagram 8(12) shows the resulting output voltage at the output of the compensator device 48, i.e. the compensator output voltage or output signal. Its state (whether at a high or a low level) is determined based on the output states of the two comparators 63, 64 and the state of the input signal $PWM_{IN}$ via the AND-gate 71 and the OR-gate 75 as shown in detail in FIG. 7.

Diagram 8(13) finally shows the resulting output signal at the amplifier output node (e.g. node 24 in FIG. 6) which by comparison with the input signal $PWM_{IN}$ shown in diagram 8(1) is a delayed version of that same input signal.

It is understood that although the present invention has mainly been exemplified by the embodiments respectively shown in FIG. 6 and in FIGS. 7 and 8 it would be possible for a skilled person to implement the teachings of the invention in alternative ways. For instance, the charging current sources 51 and 53, respectively, as well as the current sinks 52 and 54, respectively, may be implemented in practice in a number of different ways. The distinction between a "current source" and a "current sink" is in the present context merely that the source provides a well-defined charging current to the respective capacitors 61 and 62 and that the sink provides a well-defined discharging current from the respective capacitors 61 and 62. Moreover, although some inputs to comparators and gates in the described embodiments are shown and described as "non-inverting" or "inverting" it is understood that the non-inverting and inverting nature of such functional elements could be altered provided that suitable other modifications were carried out in the respective circuits. Such alternative embodiments and modifications are however also considered to fall within the scope of the present invention as defined by the appended independent claims.

The invention claimed is:

1. A method for dead time compensation in a Class-D amplifier, the Class-D amplifier comprising an input terminal for receiving a pulse modulated input signal, a power output stage having two switches, an output switching node, and a driver block configured to control the two switches, wherein the method comprises:
   receiving a pulse modulated input signal at the input terminal, the pulse modulated input signal comprising pulses with falling flanks corresponding to a falling level transition and rising flanks corresponding to a rising level transition;
   measuring a delay time between a transition of a signal from a time when a request for a transition is provided to the driver block to a time when a corresponding transition occurs at the output switching node; and
   delaying the pulse modulated input signal based on the measurement in order to provide a compensated output signal to the driver block.

2. The method according to claim 1, wherein the measuring a delay time further comprises:
   measuring a falling level transition delay from a time when a request for a falling level transition is provided to the driver block to a time when a corresponding transition occurs at the output switching node;
   measuring a rising level transition delay from a time when a request for a rising level transition is provided to the driver block to a time when a corresponding transition occurs at the output switching node;
   wherein the delaying the pulse modulated input signal further comprises:
   upon reception, at the amplifier input terminal, of a rising level transition, adding a function of the immediately previous falling level transition delay to the pulse modulated input signal, thereby providing a compensated rising level transition signal;
   upon reception, at the amplifier input terminal, of a falling level transition, adding a function of the immediately previous rising level transition delay to the pulse modulated input signal, thereby providing a compensated falling level transition signal.

3. The method according to claim 2, wherein the function of the immediately previous falling level transition delay is the measured immediately previous falling level transition delay subtracted by a minimum falling level transition delay, and wherein the function of the immediately previous rising level transition delay is the measured immediately previous rising level transition delay subtracted by a minimum rising level transition delay.

4. The method according to claim 3, wherein the minimum falling level transition delay is a first predefined constant and wherein the minimum rising level transition delay is a second predefined constant.

5. The method according to claim 3, wherein the minimum falling level transition delay is an earliest occurring falling level transition delay and wherein the minimum rising level transition delay is an earliest occurring rising level transition delay.

6. The method according to claim 2, wherein the rising level transitions delay(s) and the falling level transition delay(s) that are added to the pulse modulated input signal are individually controllable.

7. The method according to claim 1, wherein each of the two switches comprises a metal-oxide-semiconductor field-effect transistor (MOFSET).

8. A compensator device for dead time compensation in a Class-D amplifier, the compensator device comprising:
a first input terminal for receiving a pulse modulated input signal comprising pulses with falling flanks corresponding to a falling level transition and rising flanks corresponding to a rising level transition;
a second input terminal configured to receive an amplified signal provided at an output switching node of the Class-D amplifier;
delaying circuitry configured to receive and delay the pulse modulated input signal, in order to provide a compensated output signal to an output terminal of the compensator device;
measuring circuitry configured to:
measure a transition delay from a time when a request for a transition of a pulse modulated output signal provided at the output terminal of the compensator device to the corresponding transition of the amplified signal at the output switching node;
generate a control signal to the delaying circuitry based on the measurement.

9. The compensator device according to claim 8, wherein the measuring circuitry comprises:
a first measuring circuitry configured to measure a falling level transition delay from a time when a request for a falling level transition is provided at the output terminal of the compensator device to a time when the output switching node of the Class-D amplifier undergoes a corresponding falling level transition;
generate a first control signal based on the measured falling level transition delay;
a second measuring circuitry configured to measure a rising level transition delay from a time when a request for a rising level transition is provided at the output terminal of the compensator device to the time when the output switching node of the amplifier undergoes a corresponding rising level transition;
generate a second control signal based on the measured rising level transition delay;
and wherein the delaying circuitry further comprises:
a first delaying circuitry having an input terminal connected to the first input terminal of the compensator device, an output terminal connected to the output terminal of the compensator device and a control input terminal for receiving the first control signal from the controller, wherein the first delaying circuitry is configured to:
upon reception, at the first input terminal, of a rising level transition, add a function of an immediately preceding measured falling level transition delay, in order to provide a compensated rising level transition signal to the output terminal of the compensator device;
a second delaying circuitry having an input terminal connected to the first input terminal of the compensator device, an output terminal connected to the output terminal of the compensator device and a control input terminal for receiving the second control signal from the controller, wherein the second delaying circuitry is configured to:
upon reception at the first input terminal of a falling level transition, add a function of the immediately preceding measured rising level transition delay, in order to provide a compensated falling level transition signal to the output terminal of the compensator device.

10. The compensator device according to claim 8, further comprising:
an AND-gate having a first input connected to the first input terminal of the compensator device, a second input and an output;
an OR-gate having a first input connected to the output of the AND-gate, a second input and an output connected to the output terminal of the compensator device;
a first comparator having a first input, a second input and an output connected to the second input of the OR-gate;
a second comparator having a first input, a second input and an output connected to the second input of the AND-gate;
wherein the second input of each comparator is connected to a reference voltage;
wherein a first capacitor connected in parallel with a first resetting switch both are further connected between the first input of the first comparator and a ground terminal; and
wherein a second capacitor connected in parallel with a second resetting switch both are connected between the first input of the second comparator and a ground terminal;
wherein the compensator device further comprises a first charging current source connected in series with a first charging switch, which is connected in series with a first discharging switch, whereby a first node between the first charging switch and the first discharging switch is formed and wherein the first discharging switch is further connected to a first current sink;
wherein the compensator device further comprises a second current source connected in series with a second charging switch, which is connected in series with a second discharging switch, whereby a second node is formed between the second charging switch and the second discharging switch and wherein the second discharging switch is connected to a second current sink; and
wherein the first input of the first comparator is connected to the first node and the first input of the second comparator is connected to the second node.

11. The compensator device according to claim 10, wherein a discharging current flowing through each of the first current sink and the second current sink is substantially equal to the corresponding charging currents flowing through the first current source and the second current source, respectively.

12. The compensator device according to claim 10, where the input terminal is connected to a non-inverting input of the AND-gate and an inverting input of the AND-gate is connected to the output of the second comparator.

13. The compensator device according to claim 8, where the compensator device is implemented as an integrated circuit (IC).

14. A driver device for a Class-D amplifier, the driver device comprising:
- a driver block comprising:
  - an input terminal for receiving a pulse modulated input signal;
  - three output terminals connected to a gate junction of a first switch, a gate junction of a second switch and a switching node of a power stage of the Class-D amplifier;
- a compensator device according to claim 8, wherein the output terminal of the compensator device is connected to the input terminal of the driver block;
- wherein the driver device further comprises a first input terminal connected to the input terminal of the compensator device and a second input terminal connected to the switching node of power stage.

15. The driver device according to claim 14, where the driver device is implemented as an integrated circuit.

16. A Class-D amplifier comprising:
- an output stage including a first and second output switches connected in series having an intermediate switching node for connection to an output terminal of the amplifier;
- wherein the output stage is controlled by a driver device according to claim 14.

17. The Class-D amplifier of claim 16, wherein each of the first and second output switches comprises a metal-oxide-semiconductor field-effect transistor (MOFSET).

18. A Class-D amplifier comprising:
- an output stage including a first and second output switches connected in series having an intermediate switching node for connection to an output terminal of the amplifier;
- wherein the output stage is connected to a separate driver block that is controlled by a compensator device according to claim 8.

19. The Class-D amplifier of claim 18, wherein each of the first and second output switches comprises a metal-oxide-semiconductor field-effect transistor (MOFSET).

* * * * *